(12) United States Patent
Camacho

(10) Patent No.: US 8,415,206 B2
(45) Date of Patent: Apr. 9, 2013

(54) INTEGRATED CIRCUIT PACKAGING SYSTEM WITH LEAD FRAME ETCHING AND METHOD OF MANUFACTURE THEREOF

(75) Inventor: Zigmund Ramirez Camacho, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 22 days.

(21) Appl. No.: 13/070,899

(22) Filed: Mar. 24, 2011

(65) Prior Publication Data

US 2012/0241962 A1 Sep. 27, 2012

(51) Int. Cl.
*H01L 21/00* (2006.01)
(52) U.S. Cl. .................................... 438/123
(58) Field of Classification Search ............ 438/123
See application file for complete search history.

(56) References Cited

U.S. PATENT DOCUMENTS

| | | | |
|---|---|---|---|
| 7,009,286 B1 * | 3/2006 | Kirloskar et al. ............ 257/684 |
| 7,732,901 B2 | 6/2010 | Camacho et al. | |
| 7,875,988 B2 * | 1/2011 | Shoji et al. ............. 257/798 |
| 2005/0121756 A1 * | 6/2005 | Chow et al. ............. 257/676 |
| 2008/0284002 A1 | 11/2008 | Camacho et al. | |
| 2009/0309237 A1 * | 12/2009 | Chow et al. ............. 257/777 |
| 2011/0049685 A1 * | 3/2011 | Park et al. ............. 257/660 |
| 2011/0068463 A1 | 3/2011 | Camacho et al. | |

OTHER PUBLICATIONS

Philip Rogren et al., "A high Performance and Cost Effective Molded Array Package Substrate");; EoPlex Technologies, 3698-A Haven Avenue, Redwood City, Ca. 94063; Jun. 2009.*

* cited by examiner

*Primary Examiner* — Charles Garber
*Assistant Examiner* — Andre' C Stevenson
(74) *Attorney, Agent, or Firm* — Ishimaru & Associates

(57) ABSTRACT

A method of manufacture of an integrated circuit packaging system includes: providing a pre-plated leadframe having a contact pad and a die paddle pad; forming an isolated contact from the pre-plated leadframe and the contact pad; mounting an integrated circuit die over the die paddle pad; and encapsulating with an encapsulation the integrated circuit die and the isolated contact, the encapsulation having a bottom surface which is planar and exposing in the bottom surface only the contact pad and the die paddle pad.

20 Claims, 5 Drawing Sheets

INTEGRATED CIRCUIT PACKAGING SYSTEM WITH LEAD FRAME ETCHING AND METHOD OF MANUFACTURE THEREOF

TECHNICAL FIELD

The present invention relates generally to an integrated circuit packaging system, and more particularly to a system for lead frame etching.

BACKGROUND ART

Electronic products have become an integral part of our daily lives. This has created a consistent if not increasing expectation for new features, higher speed, more data, improved portability, etc. These demands have driven the development of electronic technology to reduce size, improve utility, and increase performance of the integrated circuit devices in an ever-increasing range of products such as cell phones, music players, televisions, and automobiles.

Packages of components such as semiconductor circuits, transistors, diodes, and other electronic devices must also become smaller and thinner with more functions and connections. In packaging components, the need for connecting leads largely influences package dimensions.

Lead frame packaging relies on spacing between connecting leads of a lead frame to be very small in order to connect a device having many signal pins. Width or thickness of each lead should also be reduced but leads bend easily causing unwanted open or short circuits. Unfortunately, package size is often relegated to relatively large dimensions and spacing.

Thus, a need still remains for improving numbers of leads, compatibility, flexibility, reliability, yield, and manufacturing throughput to control costs and improve performance in systems for integrated circuit packages. In view of the increasing demand for smaller electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a pre-plated leadframe having a contact pad and a die paddle pad; forming an isolated contact from the pre-plated leadframe and the contact pad; mounting an integrated circuit die over the die paddle pad; and encapsulating with an encapsulation the integrated circuit die and the isolated contact, the encapsulation having a bottom surface which is planar and exposing in the bottom surface only the contact pad and the die paddle pad.

The present invention provides an integrated circuit packaging system, including: a die paddle having a die paddle body and a die paddle pad on top and bottom of the die paddle body; an isolated contact having a contact body and a contact pad on the top and bottom of the contact body; an integrated circuit die attached to the die paddle pad; and an encapsulation having a bottom surface which is planar and exposing in the bottom surface only the contact pad and the die paddle pad.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
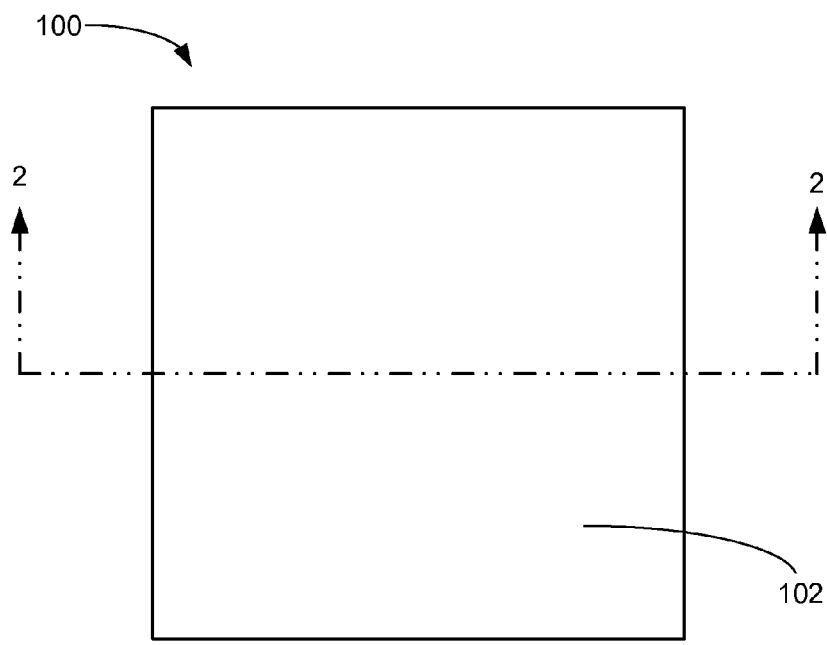
FIG. 1 is a top view of the integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the contact pad, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "on" is defined as meaning there is direct contact between elements or components with no intervening material.

The term "processing" as used herein includes deposition of material or photoresist, patterning, exposure, development, etching, cleaning, and/or removal of the material or photoresist as required in forming a described structure.

The term "planar" as used herein is defined as a surface that is flat, with no protrusions or recesses. For example, anything embedded in a planar surface will maintain planarity with the surface unless otherwise indicated.

Referring now to FIG. 1, therein is shown a top view of the integrated circuit packaging system 100 in an embodiment of the present invention. The integrated circuit packaging system 100 is shown having an encapsulation 102. The encapsulation 102 is a molding compound, such as film assisted molding, epoxy molding, or other protective molding, protects sensitive components from moisture, dust and other contamination.

Figure 2:
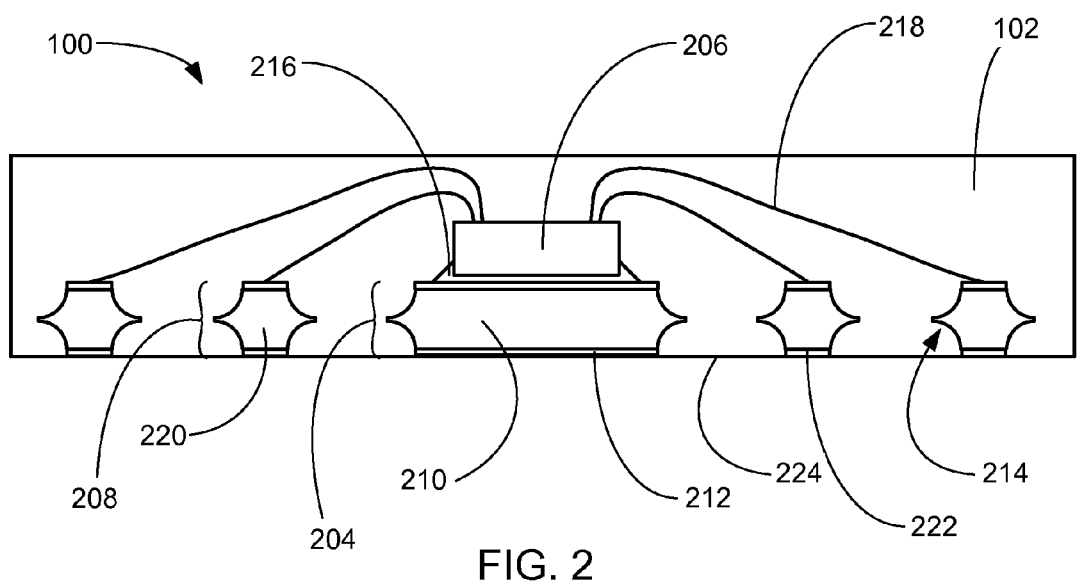
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 is shown having a die paddle 204, an integrated circuit die 206, an isolated contact 208, and the encapsulation 102, as an example.

The die paddle 204 can include a die paddle body 210 and a die paddle pad 212. The die paddle 204 provides structural support for the integrated circuit die 206. The die paddle 204 can function in other ways. For example, the die paddle 204 can connect to a next level system (not shown) or to ground or can function as a heat sink.

The die paddle body 210 provides the base structure of the die paddle 204 on which the die paddle pad 212 can be formed. The die paddle body 210 can be made from many materials such as copper, tin, zinc, or other conductive metal or alloys. The die paddle body 210 can include protrusions 214, which can serve a mold locking function, on the sides of the die paddle body 210. The protrusions 214 can be different shapes. For example, if the protrusions 214 are formed as part of an etching process, they can take the shape of two concave surfaces converging or merging to a point.

The die paddle body 210 can have a planar upper and lower surface on which there can be a die paddle pad 212. The die paddle pad 212 is a conductive metal on the top and bottom surfaces of the die paddle body 210. For example, the die paddle pad 212 can be a thin layer of conductive metal.

The die paddle pad 212 can be formed on the die paddle body 210 in a number of ways. For example, the die paddle pad 212 can be formed by a process such as sputtering, electroplating, or chemical vapor deposition (CVD). The die paddle pad 212 can be made from a metal such as gold, silver, nickel, or other conductive metal.

The integrated circuit die 206 is attached to the die paddle 204 by a die attach adhesive 216 on the die paddle pad 212. The die attach adhesive 216 is defined as a substance used to bond two or more solid elements together. The die attach adhesive 216 can be a resin, glue, paste, cement, putty, or a polyvinyl resin emulsion. The die attach adhesive 216 can partially cover the die paddle pad 212 and can partially cover the sides of the integrated circuit die 206. The integrated circuit die 206 can be attached to the die paddle 204 with the passive side facing down and the active side facing up. The integrated circuit die 206 can be connected to the isolated contact 208 with bond wires 218.

The isolated contact 208 is shown having a contact body 220 and a contact pad 222. The isolated contact 208 serves as an external connection for the integrated circuit packaging system 100. The instances of the isolated contact 208 are isolated from each other, and connect to other components in the integrated circuit packaging system 100 only by the bond wires 218.

The contact body 220 provides the base structure of the isolated contact 208 on which the contact pad 222 can be formed. The contact body 220 can be made from many different materials such as copper, tin, zinc, or other conductive metal or alloys. The contact body 220 can include the protrusions 214, which can serve a mold locking function, on the sides of the contact body 220. The protrusions 214 can be different shapes. For example, if the protrusions 214 are formed as part of an etching process, they can take the shape of two concave surfaces converging or merging at an edge or to a point.

The contact body 220 can have a planar upper and lower surface on which there can be a contact pad 222. The contact pad 222 is a conductive metal on the top and bottom surfaces of the contact body 220. For example, the contact pad 222 can be a thin layer of conductive metal.

The contact pad 222 can be formed on the contact body 220 in a number of ways. For example, the contact pad 222 can be formed by a process such as sputtering, electroplating, or chemical vapor deposition (CVD). The contact pad 222 can be made from a metal such as gold, silver, nickel, or other conductive metal. The isolated contact 208 can be connected to the integrated circuit die 206 by the bond wires 218 bonded to the contact pad 222.

The encapsulation 102 is a molding compound that protects the components in the integrated circuit packaging system 100. The encapsulation 102 can cover the integrated circuit die 206, the bond wires 218, a portion of the die paddle 204, and a portion of the isolated contact 208. The protrusions 214 can be fully within the encapsulation 102. In order to connect the package to a next level system (not shown), the encapsulation 102 can leave exposed on a bottom surface 224 only the die paddle pad 212 and the contact pad 222. This configuration can form a fully planar surface with the bottom surface 224 of the encapsulation 102, the die paddle pad 212, and the contact pad 222.

It has been discovered that exposing only the die paddle pad 212 and the contact pad 222 on the bottom surface 224 of the encapsulation 102 can reduce the chance of a solder short. For example, if part of the contact body 220 was exposed, a solder ball could be attracted to the metal in the contact body 220 during the reflow process and move off the contact pad 222, thereby possibly contacting a nearby solder ball on a different instance of the contact pad 222, causing a short. When only the contact pad 222 is exposed, it has been discovered that a solder ball will be more attracted to the contact pad 222 than the encapsulation during reflow, reducing the chance of a short.

It has been further discovered that due to the reduced chance of a solder short, exposing only the contact pad 222 on the bottom surface 224 of the encapsulation 102 can allow for closer spacing of the instances of the isolated contact 208. This can allow for a smaller package with the same number of instances of the isolated contact 208 or a larger number of the isolated contact 208 in the same size package.

The encapsulation 102 can have planar surfaces on all sides. For example, the encapsulation 102 can be planar on the bottom surface 224, the top surface, and the sides.

Figure 3:
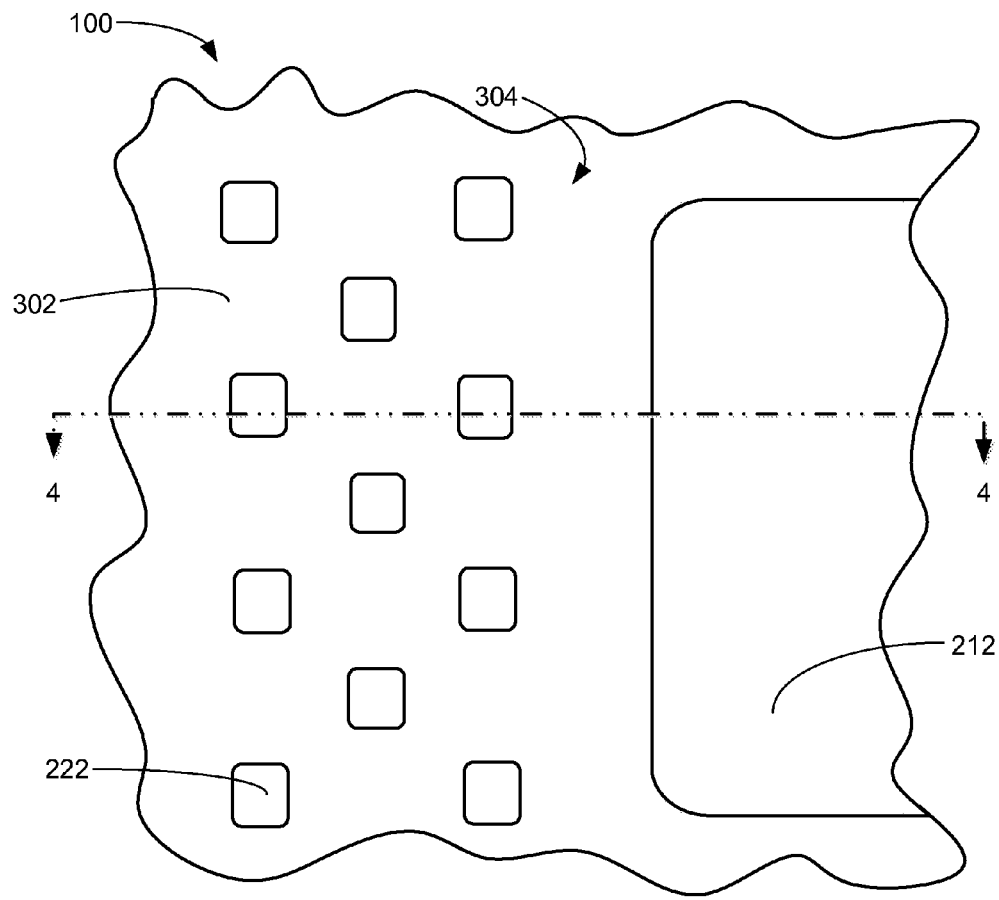
FIG. 3 is a partial bottom view of a pre-plated leadframe in a manufacturing step of the integrated circuit packaging system.

Referring now to FIG. 3, therein is shown a partial bottom view of a pre-plated leadframe 302 in a manufacturing step of the integrated circuit packaging system 100.

The pre-plated leadframe 302 can have a system side 304 and a component side. For example, the bottom view of the pre-plated leadframe 302 can show the system side 304. The pre-plated leadframe 302 can be formed with a pattern deposited on the system side 304 and the component side. For example, the pre-plated leadframe 302 can be formed with the contact pad 222 and the die paddle pad 212 deposited on the pre-plated leadframe 302 in a thin layer.

The contact pad 222 and the die paddle pad 212 can be deposited in different sizes and patterns. For example, the die paddle pad 212 can be deposited on the center of the pre-plated leadframe 302 and can be larger in size than the contact pad 222. The contact pad 222 can be deposited around the die paddle pad 212 in different patterns. For example, the contact pad 222 can be deposited around the die paddle pad 212 in staggered rows, in a grid, or other regular pattern. The staggered row pattern can function to allow for closer packing of the contact pad 222; more instances of the contact pad 222 can be fit into the same amount of space.

Figure 4:
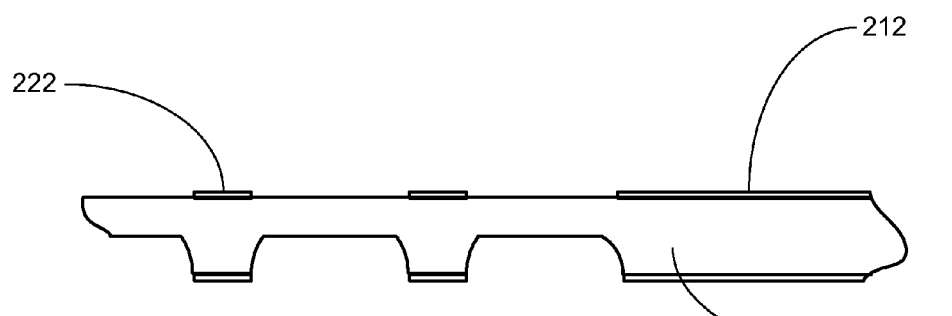
FIG. 4 is a partial cross-sectional view of the pre-plated leadframe along the line 4-4 of FIG. 3.

Referring now to FIG. 4, therein is shown a partial cross-sectional view of the pre-plated leadframe 302 along the line 4-4 of FIG. 3. The pre-plated leadframe 302 can be etched before further processing. Before etching, the contact pad 222 and the die paddle pad 212 can be applied to the pre-plated leadframe 302.

The contact pad 222 and the die paddle pad 212 can resist the etching process and the pre-plated leadframe 302 can be etched partially through the system side 304, leaving recesses in the pre-plated leadframe 302 between the areas covered by the contact pad 222 and the die paddle pad 212. For example, the recesses can be of a depth so half the thickness of the pre-plated leadframe 302 remains between the bottom of the recess and the component side of the pre-plated leadframe 302.

The recesses can have curved corners as a result of the etching process. The curved corners of the recesses can later form a portion of the protrusions 214 of FIG. 2 after a later etching step from the component side of the pre-plated leadframe 302.

Figure 5:
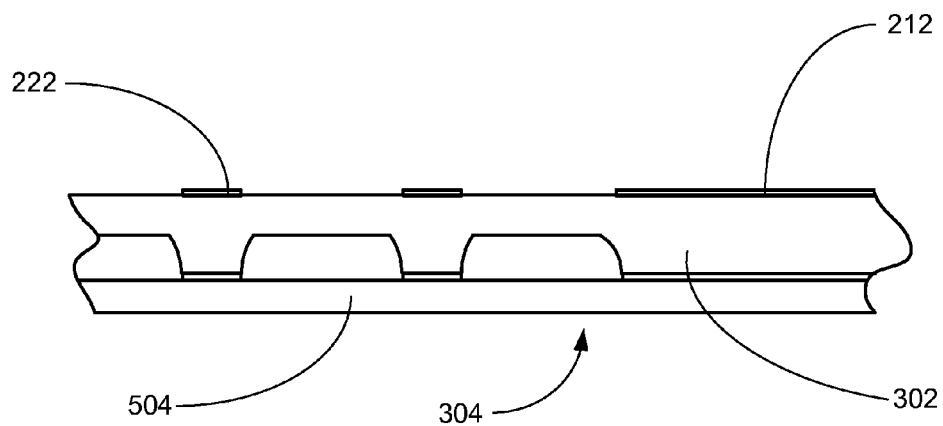
FIG. 5 is the structure of FIG. 4 in a further manufacturing step of the integrated circuit packaging system.

Referring now to FIG. 5, therein is shown the structure of FIG. 4 in a further manufacturing step of the integrated circuit packaging system 100. The system side 304 of the pre-plated leadframe 302 can be mounted on an adhesive film 504. For example, the system side 304 of the pre-plated leadframe 302 can be etched before mounting, and this means that the adhesive film 504 will contact the pre-plated leadframe only on the contact pad 222 and the die paddle pad 212.

The adhesive film 504 is a sticky material for holding components in place. The adhesive film 504 can be a tape or adhesive epoxy. For example, the adhesive film 504 can be a tape that is not damaged by the etching process such as a specially treated polymide tape, a tape with a rigid metal or polymer core, a treated singulation tape, a coverlay tape, or an alkali-resistant tape. The adhesive film 504 can also be a rigid tape or stiff carrier with a sticky side. Also for example, for ease of manufacture, the tape can be a self-healing tape.

The adhesive film 504 can be held in place by a base frame (not shown), which can hold the adhesive film 504 flat before and during etching and which can be disposable or reusable. For example, the adhesive film 504 can be a reusable base metal carrier with thermal tape. Also for example, the reusable base metal carrier with thermal tape can be similar to that used in embedded wafer level ball grid array (eWLB) manufacturing.

Figure 6:
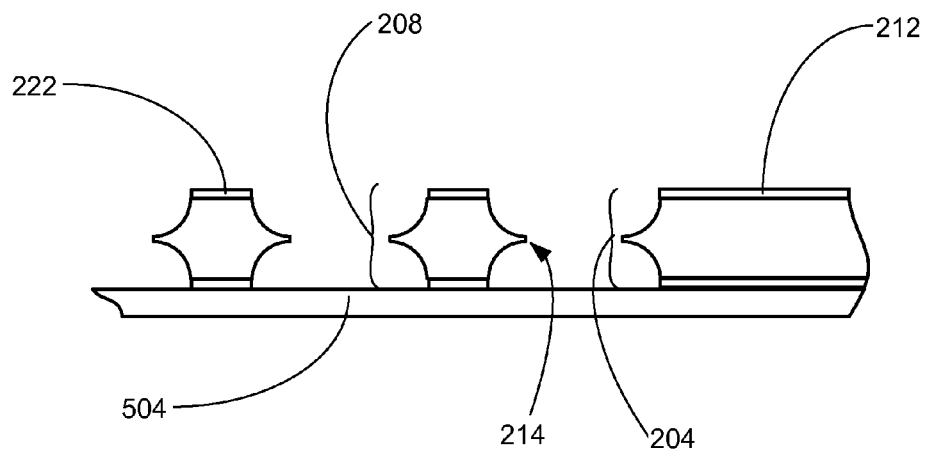
FIG. 6 is the structure of FIG. 5 in forming the isolated contact and the die paddle in a further manufacturing step of the integrated circuit packaging system.

Referring now to FIG. 6, therein is shown the structure of FIG. 5 in forming the isolated contact 208 and the die paddle 204 in a further manufacturing step of the integrated circuit packaging system 100. The pre-plated leadframe 302 of FIG. 3 can be removed from between the isolated contact 208 and the die paddle 204 in different ways. For example, the second etching step can etch through the remaining thickness of the pre-plated leadframe 302 and fully isolate the instances of the isolated contact 208 from each other and from the die paddle 204.

After the second etching step, the isolated contact 208 and the die paddle 204 can have the protrusions 214 on the sides of the isolated contact 208 and the die paddle 204. The protrusions 214 serve a mold locking function. The protrusions 214 can have a characteristic shape formed from the junction of the curved corners formed by the etching process. For example, the curved corner can start from the edge of the contact pad 222 or the die paddle pad 212 and come to a point where it meets or merges with the curved corner from the opposite side.

For illustrative purposes, the pre-plated leadframe 302 is described as being removed from between the isolated contact 208 and the die paddle 204 with etching, though it is understood that the removal can be done differently. For example, the pre-plated leadframe 302 can be removed by a process such as drilling or cutting.

Figure 7:
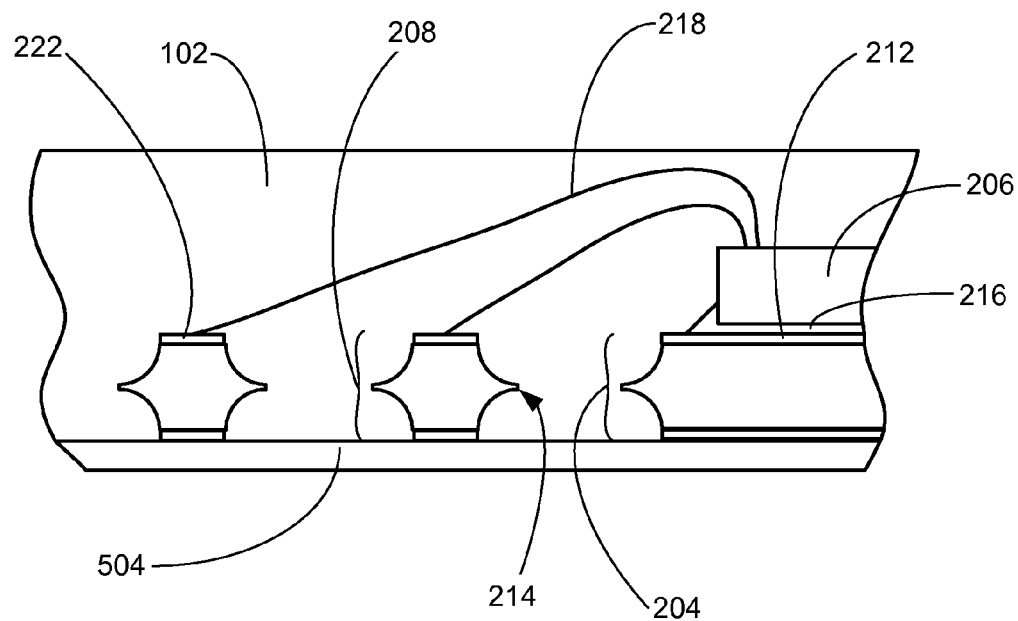
FIG. 7 is the structure of FIG. 6 after encapsulation in a further manufacturing step of the integrated circuit packaging system.

Referring now to FIG. 7, therein is shown the structure of FIG. 6 after encapsulation in a further manufacturing step of the integrated circuit packaging system 100. The integrated circuit packaging system 100 is shown in this step as having the adhesive film 504, the integrated circuit die 206, the die attach adhesive 216, the bond wires 218, and the encapsulation 102.

The integrated circuit die 206 can be attached to the die paddle 204 on the die paddle pad 212 with the die attach adhesive 216. The integrated circuit die 206 can then be connected to the isolated contact 208 by bonding the bond wires 218 from the active side of the integrated circuit die 206 to the contact pad 222 on the isolated contact 208.

After the bond wires 218 are connected, the encapsulation 102 can be used to cover the integrated circuit die 206, the bond wires 218, the isolated contact 208, the die paddle 204, and the top surface of the adhesive film 504. In this example, the top surface of the adhesive film 504 contacts the contact pad 222 and the die paddle pad 212 on the bottom surface of the isolated contact 208 and the die paddle 204, respectively. Due to this, the encapsulation 102 can cover all the components except for the contact pad 222 and the die paddle pad 212 on the bottom surface of the isolated contact 208 and the die paddle 204.

Because the encapsulation 102 covers the protrusions 214 on the isolated contact 208 and the die paddle 204, the isolated contact 208 and the die paddle 204 are mold locked in the encapsulation 102. This can prevent the isolated contact 208 and the die paddle 204 from falling out of the encapsulation 102 or being knocked out of place.

Figure 8:
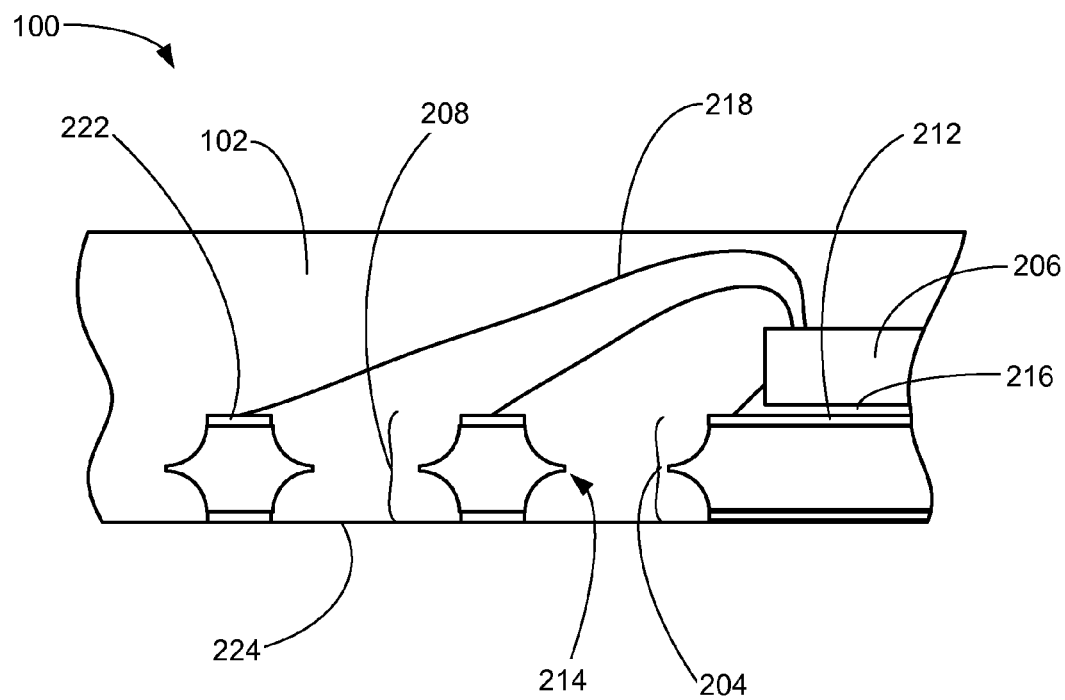
FIG. 8 is the structure of FIG. 7 after removal of the adhesive film of FIG. 5 in a further manufacturing step of the integrated circuit packaging system.

Referring now to FIG. 8, therein is shown the structure of FIG. 7 after removal of the adhesive film 504 of FIG. 5 in a further manufacturing step of the integrated circuit packaging system 100. The integrated circuit packaging system 100 is shown having all the same components as in FIG. 7 except for the removal of the adhesive film 504.

The adhesive film 504 can be removed in a number of ways. For example, the adhesive film 504 can be singulation tape, and the individual units of the integrated circuit packaging system 100 can be singulated before removal of the tape. The singulation process can be a process such as sawing, laser cutting, shearing, or other method of separating the units from each other. For example, the integrated circuit packaging system 100 can be singulated at points where it is necessary to cut through only the encapsulation 102 and the adhesive film 504.

It has been discovered that the isolated contact 208 being fully separated from the other instances of the isolated contact 208 but still held in place by the encapsulation 102 due to mold lock reduces stress on the integrated circuit packaging system 100 during singulation. One reason for this is that there is no connecting bar such as a tie bar holding the instances of the isolated contact 208 in place.

It has also been discovered that the reduction of stress on the integrated circuit packaging system 100 due to lack of stress on the isolated contact 208 and the die paddle 204 will reduce the chance of manufacturing defects. Because there is less stress on the isolated contact 208, the encapsulation 102 will conform closely to the isolated contact 208 even after singulation.

Thus, it has been discovered that the integrated circuit packaging system 100 of the present invention furnishes important and heretofore unknown and unavailable solutions, capabilities, and functional aspects for reliably manufacturing integrated circuit packages, and at the same time packing more contacts into a smaller space.

The adhesive film 504 can be removed by different processes. For example, the adhesive film 504 can be heated or cooled to reduce the adhesive properties, and then the integrated circuit packaging system can be removed from the tape. The adhesive film 504 can be removed before or after singulation. Removal of the adhesive film 504 can expose in the bottom surface 224 of the encapsulation 102 only the contact pad 222 and the die paddle pad 212.

For illustrative purposes, the adhesive film 504 is described as being removed after heating or cooling though it is understood that there are other ways of reducing the adhesion of the adhesive film 504. For example, the adhesion of the adhesive film 504 could be reduced through a process such as using UV light to reduce adhesion.

Figure 9:
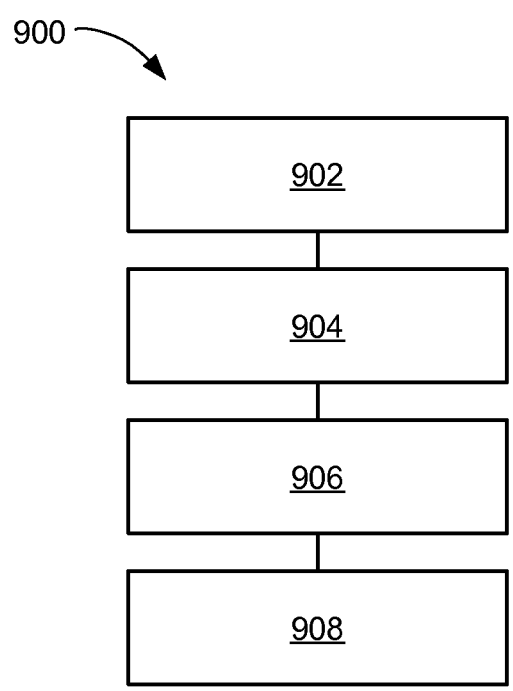
FIG. 9 is a flow chart of a method of manufacture of the integrated circuit packaging system in a further embodiment of the present invention.

Referring now to FIG. 9, therein is shown a flow chart of a method 900 of manufacture of the integrated circuit packaging system in a further embodiment of the present invention. The method 900 includes: providing a pre-plated leadframe having a contact pad and a die paddle pad in a block 902; forming an isolated contact from the pre-plated leadframe and the contact pad in a block 904; mounting an integrated circuit die over the die paddle pad in a block 906; and encapsulating the integrated circuit die and the isolated contact with an encapsulation having a bottom surface which is planar and exposing in the bottom surface only the contact pad and the die paddle pad in a block 908.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a pre-plated leadframe having a contact pad and a die paddle pad;
    forming an isolated contact from the pre-plated leadframe and the contact pad;
    mounting an integrated circuit die over the die paddle pad; and
    encapsulating with an encapsulation the integrated circuit die and the isolated contact, the encapsulation having a bottom surface which is planar and exposing only the contact pad and the die paddle pad, the isolated contact having protrusions having concave surfaces merging at an edge fully within the encapsulation.

2. The method as claimed in claim 1 wherein providing the pre-plated leadframe includes:
    providing the pre-plated leadframe etched partially through a system side on areas not covered by the contact pad and the die paddle pad.

3. The method as claimed in claim 1 wherein mounting an integrated circuit die includes:
    attaching with a die attach adhesive the integrated circuit die to the die paddle pad; and
    connecting with bond wires the integrated circuit die to the isolated contact.

4. The method as claimed in claim 1 wherein forming the isolated contact includes:
    mounting on an adhesive film the pre-plated leadframe; and
    removing the pre-plated leadframe between the contact pad and the die paddle pad.

5. The method as claimed in claim 1 wherein forming the isolated contact includes:
    forming the isolated contact with protrusions on the sides of the isolated contact having concave surfaces merging to a point and interlocking with the encapsulation.

6. A method of manufacture of an integrated circuit packaging system comprising:
    providing a pre-plated leadframe having a contact pad and a die paddle pad;
    mounting the pre-plated leadframe on an adhesive film;
    forming an isolated contact from the pre-plated leadframe and the contact pad;
    mounting an integrated circuit die on the die paddle pad; and
    encapsulating with an encapsulation the integrated circuit die and the isolated contact, the encapsulation having a bottom surface coplanar with the contact pad and the die paddle pad, and the encapsulation leaving exposed only the contact pad and the die paddle pad, the isolated contact having concave surfaces merging at an edge fully within the encapsulation.

7. The method as claimed in claim 6 wherein mounting the pre-plated leadframe on an adhesive film includes:

mounting a system side of the pre-plated leadframe on the adhesive film.

8. The method as claimed in claim 6 further comprising:
removing the adhesive film exposing only the contact pad, the die paddle pad, and the bottom surface of the encapsulation.

9. The method as claimed in claim 6 wherein forming the isolated contact includes:
forming instances of the isolated contact in staggered rows.

10. The method as claimed in claim 6 wherein providing the pre-plated leadframe includes:
providing the contact pad and the die paddle pad deposited on a component side and a system side of the pre-plated leadframe.

11. An integrated circuit packaging system comprising:
a die paddle having a die paddle body and a die paddle pad on top and bottom of the die paddle body;
an isolated contact having a contact body and a contact pad on the top and bottom of the contact body;
an integrated circuit die attached to the die paddle pad; and
an encapsulation having a bottom surface which is planar and exposing in the bottom surface only the contact pad and the die paddle pad, the isolated contact having protrusions having concave surfaces merging at an edge fully within the encapsulation.

12. The system as claimed in claim 11 wherein the bottom surface of the encapsulation has a texture matching the texture of an adhesive film.

13. The system as claimed in claim 11 further comprising:
a die attach adhesive between and on the integrated circuit die and the die paddle pad; and
bond wires connecting the integrated circuit die and the isolated contact.

14. The system as claimed in claim 11 wherein the isolated contact is vertically and horizontal symmetrical.

15. The system as claimed in claim 11 wherein the isolated contact has protrusions formed by the merging of two concave surfaces on the sides of the contact body, the concave surfaces coming to a point and interlocking with the encapsulation.

16. The system as claimed in claim 11 further comprising:
a die attach adhesive between the integrated circuit die and the die paddle pad;
bond wires connecting the integrated circuit die and the isolated contact; wherein:
the bottom surface of the encapsulation has a texture matching the texture of an adhesive film;
the isolated contact is vertically and horizontal symmetrical; and
the isolated contact has protrusions formed by the merging of two concave surfaces on the sides of the contact body, the concave surfaces coming to a point and interlocking with the encapsulation.

17. The system as claimed in claim 16 wherein the isolated contact is embedded in the encapsulation with only the contact pad exposed.

18. The system as claimed in claim 16 wherein the contact body and the die paddle body are formed from copper.

19. The system as claimed in claim 16 wherein the contact pad and the die paddle pad are made from metals or alloys comprising gold, nickel, and silver.

20. The system as claimed in claim 16 wherein the encapsulation has planar vertical edges.

\* \* \* \* \*